US006671504B1

United States Patent
Myers

(10) Patent No.: US 6,671,504 B1
(45) Date of Patent: Dec. 30, 2003

(54) RADIO SQUELCH TECHNIQUES

(75) Inventor: Michael H. Myers, Poway, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 377 days.

(21) Appl. No.: 09/675,763

(22) Filed: Sep. 29, 2000

(51) Int. Cl.[7] .................................. H04B 1/16
(52) U.S. Cl. ............... 455/212; 455/213; 455/218; 455/219; 455/221; 455/223; 455/224
(58) Field of Search ................. 455/212, 213, 455/218, 219, 220, 221, 222, 223, 224, 225

(56) References Cited

U.S. PATENT DOCUMENTS

| | | | | |
|---|---|---|---|---|
| 3,934,206 A | * | 1/1976 | Holecek | 455/220 |
| 4,038,604 A | * | 7/1977 | Koerber | 375/217 |
| 4,044,309 A | * | 8/1977 | Smith | 455/221 |
| 4,203,072 A | * | 5/1980 | Beningfield et al. | 455/223 |
| 4,411,021 A | * | 10/1983 | Yoakum | 455/222 |
| 4,414,689 A | * | 11/1983 | Enderson | 455/221 |
| 4,724,545 A | * | 2/1988 | Hamada | 455/218 |
| 4,731,873 A | * | 3/1988 | Voyce | 455/219 |
| 5,020,141 A | * | 5/1991 | Meszko | 455/166.1 |
| 5,023,940 A | * | 6/1991 | Johnson et al. | 455/212 |
| 5,465,404 A | * | 11/1995 | Retzer et al. | 455/220 |
| 6,047,170 A | * | 4/2000 | Paulsen et al. | 455/212 |
| 6,208,848 B1 | * | 3/2001 | Bertrana | 455/218 |
| 6,374,095 B1 | * | 4/2002 | Doyle et al. | 455/218 |
| 6,397,050 B1 | * | 5/2002 | Peterson et al. | 455/221 |

* cited by examiner

Primary Examiner—William Trost
Assistant Examiner—Stephen D'Agosta
(74) Attorney, Agent, or Firm—McAndrews, Held & Malloy, Ltd.

(57) ABSTRACT

A radio carrier signal is detected (20) after being converted to digital form and is filtered (22). A noise estimator (24) generates a noise estimate signal by estimating the noise in the detected signal due to atmospheric conditions and the noise due to the gain in noise figure properties of the circuitry. The output of the noise estimator is used to calculate a threshold signal (50) and another detection operation (52) determines whether the power of a signal derived from the detected signal exceeds the threshold. If the threshold is exceeded, the detected signal is passed through a signal conditioner, such as a switch (54) to an output path (56).

19 Claims, 2 Drawing Sheets

RADIO SQUELCH TECHNIQUES

BACKGROUND OF THE INVENTION

This invention relates to radio reception, and more particularly relates to the squelching of a signal received by a radio.

Squelching techniques have been known in the past. Typically, such techniques are based on an envelope detected signal which has already been subjected to automatic gain control. That is, the squelching is based on a normalized envelope detected signal. In addition, frequency division of signal and noise is used in most commercial radios.

New regulations confining aviation radio channels to an 8.33 KHz channel separation have decreased the performance capability of prior known squelch techniques. The 8.33 KHz channel separation makes the frequency separation of signal plus noise power and noise power for use in squelch operation unreliable due to carrier frequency uncertainty and the closeness of adjacent channels. As a result, a reliable method of detecting signal presence prior to baseband AGC and of deriving a measure of signal plus noise power divided by signal power is desired. Such method must not overload the processor executing baseband processing. The present invention addresses these problems and provides a solution.

BRIEF SUMMARY OF THE INVENTION

The preferred embodiment is useful in a radio receiver adapted to receive a radio frequency carrier signal. In such an environment, signal squelching is provided by generating a baseband carrier signal in response to the radio frequency carrier signal. A detected signal is generated in response to the baseband carrier signal and a noise estimate signal is generated by estimating at least the thermal noise in the detected signal. A threshold signal defining a predetermined signal level is generated in response to the noise estimate signal and one or more predetermined signal parameters. A first signal is generated in the event that a signal derived from the detected signal has a first predetermined relationship with respect to the predetermined signal level, and a second signal is generated in the event that the signal derived from the detected signal has a second predetermined relationship with respect to the predetermined signal level. The detected signal is passed in response to the first signal, and the detected signal is squelched in response to the second signal.

By using the foregoing techniques, a squelch algorithm of acceptable computational complexity for a CPU processor can be provided. An estimate of signal quality can be made even with an 8.33 KHz channel spacing. The estimate does not require extensive filtering to separate signal power plus noise and noise power alone.

DETAILED DESCRIPTION OF THE PREFERRED EMBODIMENTS

Figure 1:
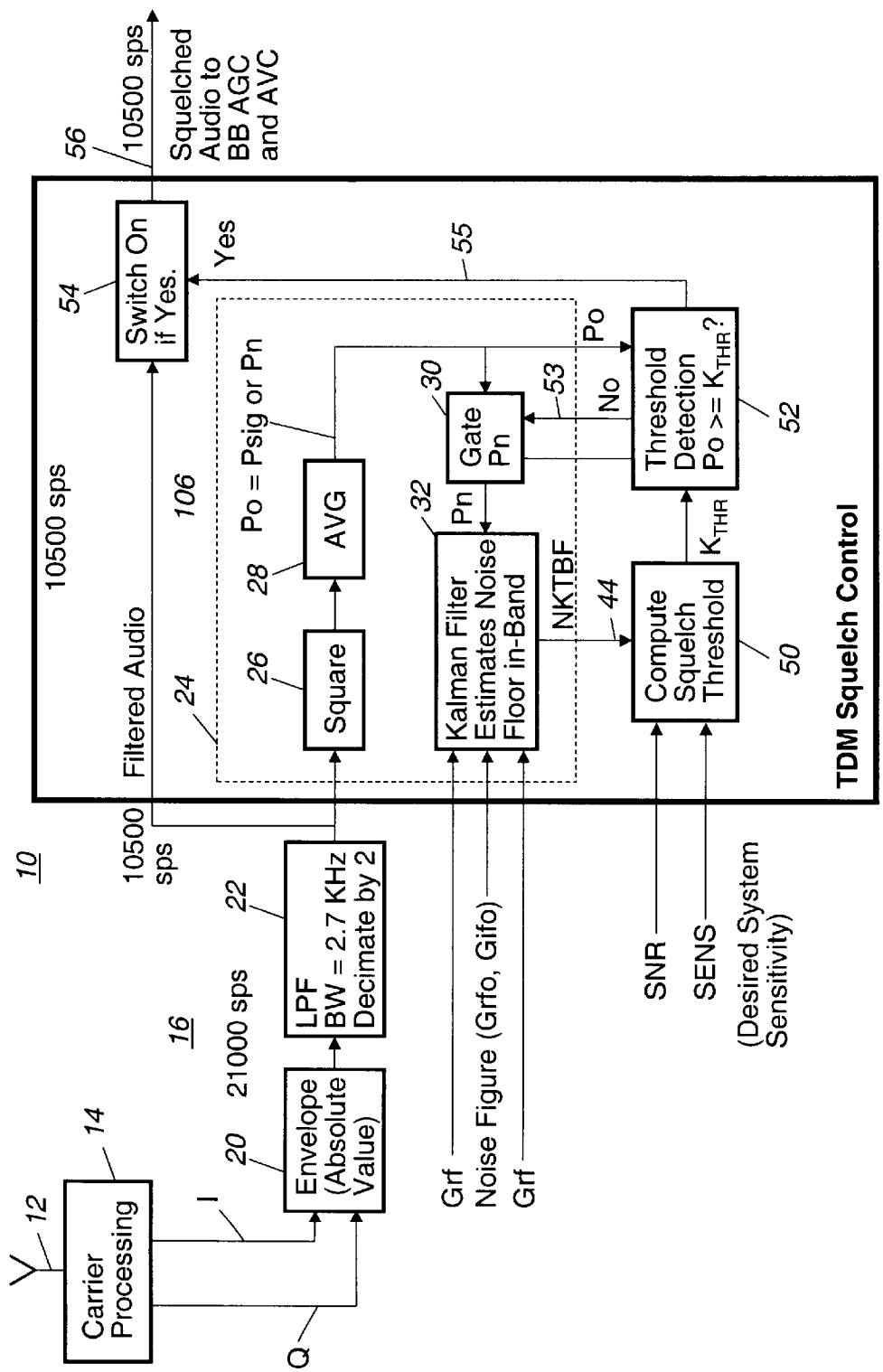
FIG. 1 is a schematic block diagram and functional block diagram of a preferred form of algorithm for squelch processing made in accordance with the present invention.

Referring to FIG. 1, a preferred form of radio receiver 10 made in accordance with the present invention includes a conventional antenna 12 which receives a radio frequency carrier signal that is modulated by amplitude modulation and is transmitted in the VHF range of about 118–137 MHz. The radio frequency carrier signal is processed by carrier processing circuitry 14 that generates a baseband carrier signal in response to the radio frequency carrier signal.

A preferred form of carrier processing circuitry is described in the patent application Ser. No. 09/677,317 entitled Radio Receiver Automatic Gain Control Techniques, filed on the same date as this application, filed in the name of the same inventor, assigned to the same assignee, and incorporated by reference into this application. The carrier processing circuitry 14 provides AGC control for the radio frequency (RF) carrier signal, as well as an intermediate frequency (IF) carrier signal generated by circuitry 14. The carrier processing circuitry 14 converts the IF carrier to digital form and then converts the IF carrier to a baseband digital carrier signal. Circuitry 14 also resamples the digital baseband carrier to 42 kilosamples per second and generates orthogonal I and Q signals representing the baseband carrier. The conversion of the IF carrier to the baseband digital carrier and resampling is preferably accomplished by a digital signal processor 16 which performs the additional functions illustrated by blocks 20–52 in the remainder of FIG. 1.

The algorithm performed by processor 16 executes in real time floating point arithmetic. The algorithm performs an envelope detection operation 20 on the envelope of the baseband carrier signal which has been partially normalized by an IF and RF automatic gain control, but not by any baseband automatic gain control. The detected signal has a residual dynamic range of 67 decibels from which is derived a reliable estimate of signal with noise power and of noise power alone. Narrow band Mode 0 channels have an assigned 8.33 KHz frequency separation, making it difficult and unreliable to try to filter outside the band for a noise estimate. The detected signal is filtered by a decimate by 2 frequency impulse response (FIR) filter operation 22 with a six decibel bandwidth of 2.7 KHz and 60 decibel bandwidth of 3.5 KHz.

Basically, the algorithm passes the detected and filtered audio signal when the average power out of FIR 22 exceeds a threshold based on the best estimate of the noise floor from the receiver gain distribution, the desired detection probability, and the measured noise whenever a signal is absent. At initialization, the noise floor is calculated from the known gain distribution. When the channel is turned on, noise is measured when signal is absent, and the noise floor is updated in a Kalman filter. On a given channel, the noise estimate generally improves with time.

At the start of the receive mode, the threshold is initialized to 6 decibels (adjustable) above an estimate of the noise floor. The estimate changes based on the known noise figure of the receiver, the desired probability of detection and false triggering, the known gain distribution which changes as the RF and IF attenuators change (driven by the AGC loops shown in the above-referenced application), on the minimum signal strength (sensitivity) desired, and the desired minimum signal to noise ratio (SNR). operation 26 and an averaging operation 28 which generates a signal PO corresponding to the averaged power out of the FIR filter operation 22. A Kalman filter operation 32 estimates the noise floor in-band value based on the PO value which is transmitted through a gate 30 when the PO value is below a threshold. Filter operation 32 also is based on the gain of the radio frequency stages (Grf) and the gain of the intermediate frequency stages (Gif), as well as a noise figure calculated for the various circuits in processing circuitry 14. The Grf and Gif values change depending on the gains dictated by the AGC operation in circuitry 14.

The noise floor is transmitted along a signal path 44 and is used by a squelch threshold compute operation 50 which is based on a desired minimum signal to noise ratio (SNR) and a minimum signal strength or sensitivity (SENS). The SNR and SENS values are constants in the algorithm. The threshold calculated in operation 50 is transmitted to a threshold detection operation 52 which generates a first signal along a path 53 to gate 30 in the event that the PO value is less than the threshold and generates another signal along a path 55 in the event that the PO value is greater than the threshold (i.e., when the averaged power of the detected signal is greater than the threshold). In response to the signal in path 55, a signal conditioner 54, such as a switch, passes the detected signal to an output path 56.

Figure 2:
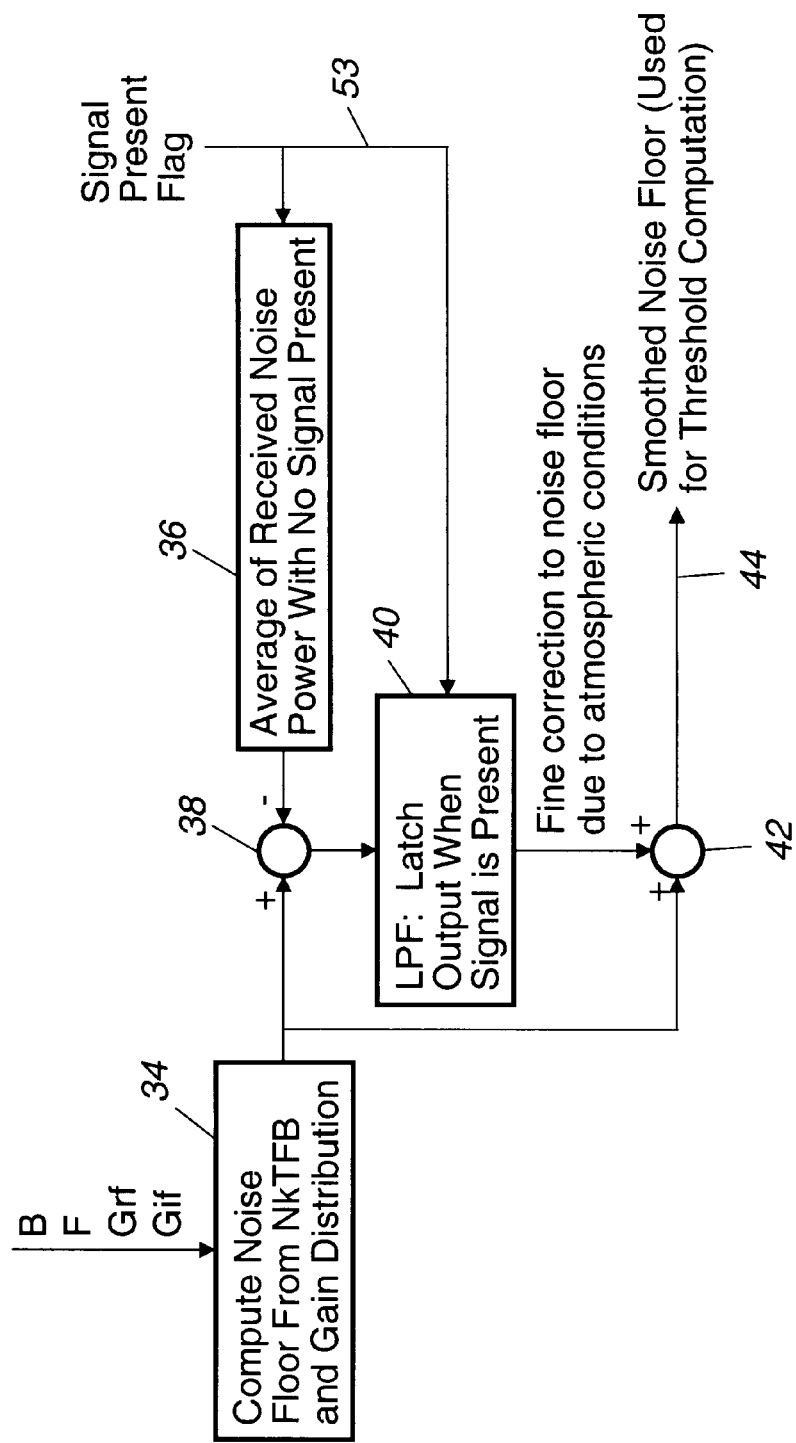
FIG. 2 is a flow diagram illustrating in more detail a portion of the functional block diagram shown in FIG. 1.

As a result of the foregoing operation, gate 30 passes the PO signal to a Kalman filter operation 32 when it consists primarily of noise power alone. Additional details about Kalman filter operation 32 are shown in FIG. 2. In response to the signal on path 53, the average of the received noise power (i.e., the average of signal PO when signal PO consists at least primarily of noise) is calculated in an operation 36. In addition, the noise floor (NkTFB) and the gain distribution from the RF and IF frequency stages of circuitry 14 (Grf and Gif) are calculated in operation 34. NkTFB means: NkRT=Thermal noise (−204 dbw for T=290° K normally), F=receiver noise figure and B=receive bandwidth.

The values resulting from operations 34 and 36 are subtracted in a subtraction operation 38 and the results are latched in a latching operation 40 when a signal is present on path 53 indicating that the PO value is less than the threshold determined in operation 50. The signal resulting from latching operation 40 and noise floor computation operation 34 are added in an adding operation 42 to result in the smoothed noise floor value transmitted on path 44 to the squelch threshold computing operation 50.

Referring to FIG. 2, noise power alone is updated by operations 34 and 36 whenever PO is less than the threshold and is taken over several samples before the detection occurs to avoid signal contamination. The combined signal power with noise power (PS) is computed when the threshold calculated by operation 50 is exceeded, making the signal to noise estimates orthogonal in time. The algorithm assumes that the channel noise statistics are quasi-stationary between noise and signal power estimates (i.e., are slowly varying on the same channel).

Those skilled in the art will recognize that the preferred embodiments may be altered and modified without departing from the true spirit and scope of the invention as defined in the appended claims.

What is claimed is:

1. In a radio receiver adapted to receive a radio frequency carrier signal, apparatus for providing signal squelching comprising:

carrier processing circuitry arranged to generate a baseband carrier signal in response to said radio frequency carrier signal;

a detector arranged to generate a detected signal in response to said baseband carrier signal;

a noise estimator arranged to generate a noise estimate signal by estimating at least the noise in the detected signal due to atmospheric conditions;

a threshold calculator arranged to calculate a threshold signal defining a predetermined signal level in response to the noise estimate signal and one or more predetermined signal parameters;

a threshold detector arranged to generate a first signal in the event that a signal derived from said detected signal has a first predetermined relationship with respect to said predetermined signal level and to generate a second signal in the event that said signal derived from said detected signal has a second predetermined relationship with respect to said predetermined level, said noise estimator being responsive to said detected signal in the event said second signal is generated and being unresponsive to said detected signal in the event said first signal is generated; and a signal conditioner arranged to pass said detected signal in response to said first signal and to squelch said detected signal in response to said second signal.

2. Apparatus, as claimed in claim 1, wherein said noise estimator is responsive to said detected signal before said detected signal is subjected to automatic gain control.

3. Apparatus, as claimed in claim 1, wherein said baseband carrier signal comprises a digital signal and wherein said detector, noise estimator, threshold calculator and threshold detector comprise operations performed by a digital processor.

4. Apparatus, as claimed in claim 1, wherein said one or more signal parameters comprise a minimum signal to noise ratio.

5. Apparatus, as claimed in claim 1, wherein said signal conditioner comprises a switch.

6. Apparatus, as claimed in claim 1, wherein said noise estimator further estimates the noise present in the detected signal due to receiver noise generated in at least part of the receiver.

7. In a radio receiver adapted to receive a radio frequency carrier signal, a method of providing signal squelching comprising:

generating a baseband carrier signal in response to said radio frequency carrier signal;

generating a detected signal in response to said baseband carrier signal;

generating a noise estimate signal by estimating at least the noise in the detected signal due to atmospheric conditions;

calculating a threshold signal defining a predetermined signal level in response to the noise estimate signal and one or more predetermined signal parameters;

generating a first signal in the event that a signal derived from said detected signal has a first predetermined relationship with respect to said predetermined signal level;

generating a second signal in the event that said signal derived from said detected signal has a second predetermined relationship with respect to said predetermined level, said generating a noise estimate signal comprising generating a noise estimate signal in response to said detected signal in the event said second signal is generated and generating a noise estimate signal unresponsive to said detected signal in the event said first signal is generated;

passing said detected signal in response to said first signal; and squelching said detected signal in response to said second signal.

8. A method, as claimed in claim 7, wherein said generating a noise estimate signal comprises generating a noise estimate signal responsive to said detected signal before said detected signal is subjected to automatic gain control.

9. A method, as claimed in claim 7, wherein said generating a baseband carrier signal comprises generating a digital baseband carrier signal and wherein said generating a detected signal, generating a noise estimate signal, calculating a threshold signal, generating a first signal and generating a second signal comprise digital processing.

10. A method, as claimed in claim 7, wherein said passing and said squelching each comprise switching.

11. A method, as claimed in claim 7, wherein said generating a first signal comprises generating a first signal in the event that a signal derived from said detected signal has an averaged power derived from the detected signal greater than the predetermined signal level.

12. In a radio receiver adapted to receive a radio frequency carrier signal, apparatus for providing signal squelching comprising:
  carrier processing circuitry arranged to generate a baseband carrier signal in response to said radio frequency carrier signal;
  a detector arranged to generate a detected signal in response to said baseband carrier signal;
  a noise estimator arranged to generate a noise estimate signal by estimating at least the noise in the detected signal due to atmospheric conditions;
  a threshold calculator arranged to calculate a threshold signal defining a predetermined signal level in response to the noise estimate signal and one or more predetermined signal parameters comprising a minimum strength or sensitivity of said detected signal and a desired probability of detecting said minimum signal strength;
  a threshold detector arranged to generate a first signal in the event that a signal derived from said detected signal has a first predetermined relationship with respect to said predetermined signal level and to generate a second signal in the event that said signal derived from said detected signal has a second predetermined relationship with respect to said predetermined level; and
  a signal conditioner arranged to pass said detected signal in response to said first signal and to squelch said detected signal in response to said second signal.

13. In a radio receiver adapted to receive a radio frequency carrier signal, apparatus for providing signal squelching comprising:
  carrier processing circuitry arranged to generate a baseband carrier signal in response to said radio frequency carrier signal;
  a detector arranged to generate a detected signal in response to said baseband carrier signal;
  a noise estimator arranged to generate a noise estimate signal by estimating at least the noise in the detected signal due to atmospheric conditions;
  a threshold calculator arranged to calculate a threshold signal defining a predetermined signal level in response to the noise estimate signal and one or more predetermined signal parameters;
  a threshold detector arranged to generate a first signal in the event that a signal derived from said detected signal has a first predetermined relationship with respect to said predetermined signal level, the first predetermined relationship comprising an average of the square of the detected signal greater than the predetermined signal level, and to generate a second signal in the event that said signal derived from said detected signal has a second predetermined relationship with respect to said predetermined level; and
  a signal conditioner arranged to pass said detected signal in response to said first signal and to squelch said detected signal in response to said second signal.

14. In a radio receiver adapted to receive a radio frequency carrier signal, apparatus for providing signal squelching comprising:
  carrier processing circuitry arranged to generate a baseband carrier signal in response to said radio frequency carrier signal;
  a detector arranged to generate a detected signal having a noise component in response to said baseband carrier signal;
  a noise estimator arranged to generate a noise estimate signal by estimating at least the noise in the detected signal due to atmospheric conditions, said noise estimator comprising a calculator arranged to generate a noise power signal related to an average of said noise component of the detected signal and a latch arranged to store said noise power signal in response to said first signal;
  a threshold calculator arranged to calculate a threshold signal defining a predetermined signal level in response to the noise estimate signal and one or more predetermined signal parameters;
  a threshold detector arranged to generate a first signal in the event that a signal derived from said detected signal has a first predetermined relationship with respect to said predetermined signal level, the first predetermined relationship comprising an averaged power derived from the detected signal greater than said predetermined signal level, and to generate a second signal in the event that said signal derived from said detected signal has a second predetermined relationship with respect to said predetermined level; and
  a signal conditioner arranged to pass said detected signal in response to said first signal and to squelch said detected signal in response to said second signal.

15. Apparatus, as claimed in claim 14, wherein said calculator comprises a Kalman filter.

16. In a radio receiver adapted to receive a radio frequency carrier signal, a method of providing signal squelching comprising:
  generating a baseband carrier signal in response to said radio frequency carrier signal;
  generating a detected signal in response to said baseband carrier signal;
  generating a noise estimate signal by estimating at least the noise in the detected signal due to atmospheric conditions;
  calculating a threshold signal defining a predetermined signal level in response to the noise estimate signal, a minimum signal to noise ratio and a minimum strength or sensitivity of said detected signal;
  generating a first signal in the event that a signal derived from said detected signal has a first predetermined relationship with respect to said predetermined signal level;
  generating a second signal in the event that said signal derived from said detected signal has a second predetermined relationship with respect to said predetermined level;
  passing said detected signal in response to said first signal; and squelching said detected signal in response to said second signal.

17. In a radio receiver adapted to receive a radio frequency carrier signal, a method of providing signal squelching comprising:

generating a baseband carrier signal in response to said radio frequency carrier signal;

generating a detected signal in response to said baseband carrier signal;

generating a noise estimate signal by estimating at least the noise in the detected signal due to atmospheric conditions;

calculating a threshold signal defining a predetermined signal level in response to the noise estimate signal and one or more predetermined signal parameters;

generating a first signal in the event that a signal derived from said detected signal has an average of the square of the detected signal greater than the predetermined signal level;

generating a second signal in the event that said signal derived from said detected signal has a second predetermined relationship with respect to said predetermined level;

passing said detected signal in response to said first signal; and squelching said detected signal in response to said second signal.

18. In a radio receiver adapted to receive a radio frequency carrier signal, a method of providing signal squelching comprising:

generating a baseband carrier signal in response to said radio frequency carrier signal;

generating a detected signal with a noise component in response to said baseband carrier signal;

generating a noise estimate signal by estimating at least the noise in the detected signal due to atmospheric conditions and by estimating the noise present in the detected signal due to receiver noise generated in at least part of the receiver;

calculating a threshold signal defining a predetermined signal level in response to the noise estimate signal and one or more predetermined signal parameters;

generating a first signal in the event that a signal derived from said detected signal has a first predetermined relationship with respect to said predetermined signal level, said generating a noise estimate signal comprising generating a noise power signal related to an average of said noise component of the detected signal and latching said noise power signal in response to said first signal;

generating a second signal in the event that said signal derived from said detected signal has a second predetermined relationship with respect to said predetermined level;

passing said detected signal in response to said first signal; and squelching said detected signal in response to said second signal.

19. A method, as claimed in claim 18, wherein said generating a noise power signal comprises Kalman filtering.

* * * * *